(12) United States Patent
Van Dyke

(10) Patent No.: US 11,380,461 B2
(45) Date of Patent: Jul. 5, 2022

(54) SUPERCONDUCTING FLEXIBLE INTERCONNECTING CABLE CONNECTOR

(71) Applicant: Jonathan Francis Van Dyke, Baltimore, MD (US)

(72) Inventor: Jonathan Francis Van Dyke, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 557 days.

(21) Appl. No.: 16/460,705

(22) Filed: Jul. 2, 2019

(65) Prior Publication Data

US 2021/0005353 A1    Jan. 7, 2021

(51) Int. Cl.
| H01B 12/02 | (2006.01) |
| H01R 4/68 | (2006.01) |
| H01R 13/453 | (2006.01) |
| H01L 39/00 | (2006.01) |

(52) U.S. Cl.
CPC .............. *H01B 12/02* (2013.01); *H01L 39/00* (2013.01); *H01R 4/68* (2013.01); *H01R 13/453* (2013.01)

(58) Field of Classification Search
None
See application file for complete search history.

(56) References Cited

U.S. PATENT DOCUMENTS

| 5,338,207 A | 8/1994 | Lineberry et al. |
| 5,600,101 A | 2/1997 | Sakai |
| 6,280,201 B1 | 8/2001 | Morris |
| 6,344,616 B1 | 2/2002 | Yokokawa |
| 6,378,757 B1 | 4/2002 | Holcombe et al. |
| 6,402,525 B2 | 6/2002 | Gugliotti et al. |
| 6,531,233 B1 * | 3/2003 | Pourrahimi ............. H01L 39/02 505/231 |
| 6,719,574 B2 | 4/2004 | Grek |

(Continued)

FOREIGN PATENT DOCUMENTS

| EP | 1246307 A1 | 10/2002 |
| JP | 2001250614 A | 9/2001 |

OTHER PUBLICATIONS

International Search Report for Application No. PCT/US2020/036970 dated Nov. 25, 2020.

(Continued)

*Primary Examiner* — Benjamin P Sandvik
(74) *Attorney, Agent, or Firm* — Tarolli, Sundheim, Covell & Tummino LLP

(57) ABSTRACT

A superconducting flexible interconnecting cable connector for supercomputing systems is provided. The cable connector includes a base with a recessed area defined therein to receive superconducting flexible interconnecting cables and superconducting connecting chips to electrically connect the superconducting flexible interconnecting cables to each other. A cover is provided to cover the superconducting flexible interconnecting cables and the superconducting connecting chips when the cover is in a closed position. A compression device compresses the superconducting connecting chips together to secure the superconducting flexible interconnecting cables and the superconducting connecting chips inside the recessed area of the base when the cover is in the closed position.

20 Claims, 8 Drawing Sheets

(56) References Cited

U.S. PATENT DOCUMENTS

| | | | |
|---|---|---|---|
| 7,186,145 B1 | | 3/2007 | Feldman et al. |
| D611,014 S | | 3/2010 | Huang |
| 8,808,492 B2 | * | 8/2014 | Huang .................... H01L 39/24 |
| | | | 156/272.2 |
| 9,472,878 B2 | | 10/2016 | Costello et al. |
| 10,840,616 B2 | * | 11/2020 | Brittles .................... H01R 4/68 |
| 2005/0239300 A1 | | 10/2005 | Yasumura et al. |
| 2006/0021788 A1 | * | 2/2006 | Kohayashi ............... H01R 4/68 |
| | | | 174/125.1 |
| 2006/0273446 A1 | | 12/2006 | Sato et al. |
| 2012/0108435 A1 | * | 5/2012 | Ichiki .................... H02G 15/34 |
| | | | 505/430 |
| 2018/0191094 A1 | | 7/2018 | Wang et al. |
| 2018/0261932 A1 | * | 9/2018 | Tuckerman .............. H01R 4/48 |
| 2019/0027800 A1 | * | 1/2019 | El Bouayadi ........ H05K 1/0245 |

OTHER PUBLICATIONS

Australian Examination Report for Application No. 2017330506 dated Dec. 18, 2019.
European Office Action in Application Serial No. 17768618.5-1202 dated Jan. 21, 2020.
Korean Office Action for Application No. 10-2019-7009191 dated Feb. 24, 2020.

* cited by examiner

SUPERCONDUCTING FLEXIBLE INTERCONNECTING CABLE CONNECTOR

This disclosure relates generally to a superconducting computing system and more specifically, to a superconducting flexible interconnecting cable connector for superconducting computing systems.

BACKGROUND

In superconducting computing environments, components are required to operate at temperatures below the critical temperature of the component (i.e., at cryogenic temperatures). One such component includes superconducting flexible interconnecting cables (or ribbon). These interconnecting cables facilitate electrical continuity between multi-chip modules (MCM) assemblies in superconducting computing systems at low temperatures (e.g., 0-10 Kelvin). The interconnecting cables are attached to an MCM assembly at one end and connected to another interconnecting cable at an opposite end. The connection between the two ends of the interconnecting cables are critical to maintain electrical continuity between MCM assemblies.

SUMMARY

The following presents a simplified summary in order to provide a basic understanding of the subject disclosure. This summary is not an extensive overview of the subject disclosure. It is not intended to identify key/critical elements or to delineate the scope of the subject disclosure. Its sole purpose is to present some concepts of the subject disclosure in a simplified form as a prelude to the more detailed description that is presented later.

One example of the subject disclosure includes a superconducting flexible interconnecting cable connector that includes a base having a recessed area defined therein to receive superconducting flexible interconnecting cables and superconducting connecting chips to electrically connect the superconducting flexible interconnecting cables to each other. A cover covers the superconducting flexible interconnecting cables and the superconducting connecting chips when the cover is in a closed position. A compression device compresses the superconducting connecting chips together to secure the superconducting flexible interconnecting cables and the superconducting connecting chips inside the recessed area of the base when the cover is in the closed position.

Another example of the subject disclosure includes a superconducting computing system that includes superconducting multi-chip module assemblies in a stacked arrangement and superconducting flexible interconnecting cables electrically communicatively linking the superconducting multi-chip assemblies to each other. Superconducting connecting chips electrically communicatively linking ends of the superconducting flexible interconnecting cables together. Superconducting flexible interconnecting cable connectors that include a base have a recessed area to receive the superconducting connecting chips and the superconducting flexible interconnecting cables to ensure electrical continuity between metal traces in the superconducting flexible interconnecting cables and metal traces in the superconducting connecting chips.

Still another example of the subject disclosure includes a method of connecting a superconducting flexible interconnecting cable connector for a superconducting computing system that includes bonding a ground side of a first superconducting interconnecting cable from a first multi-chip module assembly to a first superconducting connecting chip, wherein the first superconducting connecting chip is coated with a ground plane and bonding a side having metal traces thereon of a second superconducting interconnecting cable from a second multi-chip module assembly to metal traces on a second superconducting connecting chip. The method further includes inserting the first superconducting connecting chip and the first superconducting interconnecting cable into a recess of a base of the superconducting flexible interconnecting cable connector and inserting the second superconducting connecting chip and the second superconducting interconnecting cable into the main recess of the base of the superconducting flexible interconnecting cable connector over the first superconducting connecting chip. A cover of the superconducting flexible interconnecting cable connector is secured onto the base.

BRIEF DESCRIPTION OF THE DRAWINGS

The accompanying drawings, which are incorporated in and constitute a part of the specification, illustrate various systems, methods, and other examples of the disclosure. Illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa.

DETAILED DESCRIPTION

Figure 1:
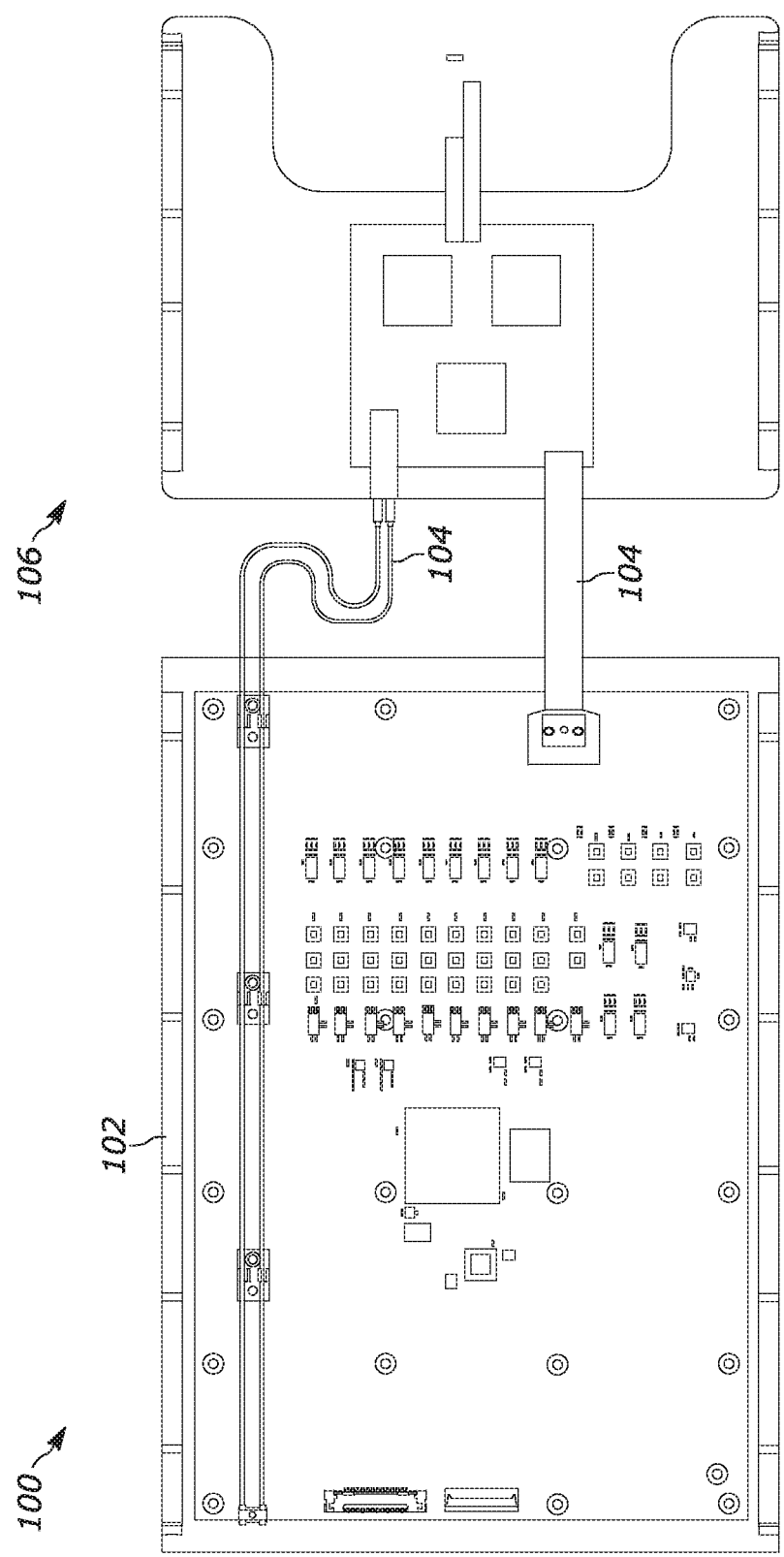
FIG. 1 is a top view of a partial superconducting computing system.

The disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure can be practiced without these specific details. In other instances, well-known structures and devices are shown in block diagram form in order to facilitate describing the subject disclosure.

While specific characteristics are described herein (e.g., thickness, orientation, configuration, etc.), it is to be understood that the features, functions and benefits of the subject disclosure can employ characteristics that vary from those described herein. These alternatives are to be included within the scope of the disclosure and claims appended hereto.

As mentioned above, components in supercomputing environments are required to operate at temperatures below the critical temperature of the component (i.e., at cryogenic temperatures). Superconducting flexible interconnecting cables (or ribbon) facilitate electrical continuity between superconducting multi-chip module (MCM) assemblies in superconducting computing systems at low temperatures (e.g., 0-10 Kelvin). The interconnecting cables are attached to an MCM assembly at one end and connected to another interconnecting cable at an opposite end. The connection between the two ends of the interconnecting cables are critical to maintain electrical continuity between MCM assemblies.

Typically, the end of each interconnecting cable is connected to a connecting chip that includes alignment pins. The connecting chip includes metal traces that align with metal traces in the interconnecting cables. The signal then travels through one interconnecting cable to the connecting chip and then to the other interconnecting cable. The disadvantage of this assembly is that it is difficult to align the traces on each interconnecting cable with the connecting chip since there is no external device to secure the connection. As a result, the connection is unreliable and thus, electrical continuity between MCM assemblies is compromised. In addition, since the computing system is installed in vacuum system utilizing a closed cycle refrigerator to obtain the superconducting temperatures, the process of cooling the computing system to the correct operating temperature takes approximately 10 hours. If there is a continuity issue between the interconnecting cable, the computing system needs to be warmed in order to fix the continuity problem and then cooled again to the superconducting temperature. This process can take up to a day for each failure. Still further, the interconnecting cables are fragile and likely to break if mishandled. Thus, if an interconnecting cable is broken the entire MCM must be reworked to attach a new interconnecting cable resulting in device down time as well as incurring the costs associated with rework.

Disclosed herein is a superconducting interconnecting cable connector that overcomes the aforementioned disadvantages. The interconnecting cable connector securely connects the interconnecting cables to each other thereby improving electrical continuity reliability. Specifically, the interconnecting cable connector includes a recess that allows the interconnecting cables and associated interconnecting cable connectors to nest with no shifting or movement. A compression device compresses the interconnecting cable connectors together to assure that no movement occurs within the recess and to ensure electrical contact between interconnecting cables. As a result, the interconnecting cable connector provides a means to finely align the traces between the two interconnecting cables thereby improving reliability. In addition, since the interconnecting cable is easily removed from the interconnecting cable connector, the risk of breaking the interconnecting cable is mitigated.

Figure 2:
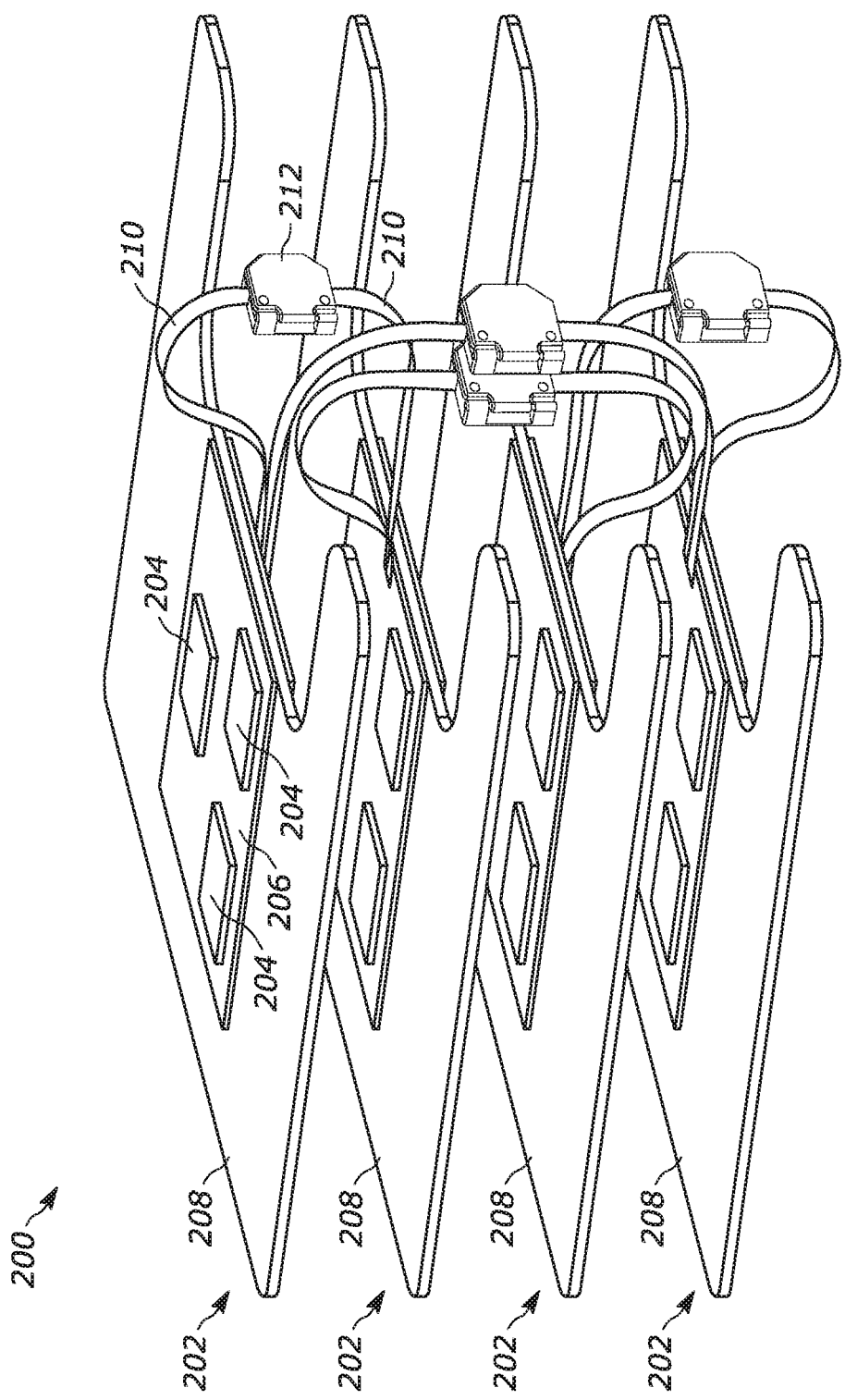
FIG. 2 illustrates an example MCM stacked assembly.

Referring to FIGS. 1 and 2, FIG. 1 is a top view of a partial superconducting computing system 100 (e.g., Reciprocal Quantum Logic (RQL) computing system) that includes a printed circuit board 102 connected, via electrical communication cables 104, to superconducting multi-chip module (MCM) stacked assembly 106. The printed circuit board 102 provides electronic support (e.g., power) for the MCM stacked assembly 106. The MCM stacked assembly 106 is configured to provide computing functions in, for example, a data center at temperatures in the range of approximately 0-10K. Due to space constraints, the MCM stacked assembly 106 includes multiple MCM assemblies in a stacked arrangement, as described below.

FIG. 2 illustrates an example MCM stacked assembly 200 that includes multiple MCM assemblies 202 linked together in a daisy chain fashion. The MCM stacked assembly 200 is similar to the MCM stacked assembly illustrated in FIG. 1. Thus, reference is to be made to the example of FIG. 1 in the following description of the example in FIG. 2. Each MCM assembly 202 includes superconducting chips (e.g., RQL chip) 204 attached to a substrate (e.g., silicon substrate) 206. The substrate 206 is attached to a metal heat spreader 208. The MCM assemblies 202 further include superconducting flexible interconnecting cables (hereinafter "interconnecting cable") 210 connected to the substrate 206. The interconnecting cables 210 include electrically conductive metal traces (not shown) on one side and a ground plane (not shown) on an opposite side. The interconnecting cables 210 attach to the substrate in a manner that the metal traces in the interconnecting cables 210 attach to electrically conductive pads (not shown) on the substrate 206. Thus, all signals from the superconductive chips 204 are channeled in electrical traces in the substrate 206 to the electrically conductive pads on the substrate 206 and transmitted through the interconnecting cables 210.

Interconnecting cables 210 between MCM assemblies 202 are connected together with a superconducting flexible interconnecting cable connector (hereinafter "cable connector") 212. The cable connector 212 is made from a non-magnetic metal (e.g., aluminum, phosphor-bronze, beryllium-copper, etc.). As will be described below, the cable connector 212 provides a securing means that allows the interconnecting cables and connecting chips to nest in a recess with no movement. When the cable connector 212 is in a closed position, a compression device compresses the connecting chips, which are attached to ends of the interconnecting cables 210, together to assure that no movement occurs within the recess and to ensure electrical contact. As a result, the cable connector 212 provides a means to finely align the metal traces between the two interconnecting cables 210 thereby improving reliability.

Figure 3:
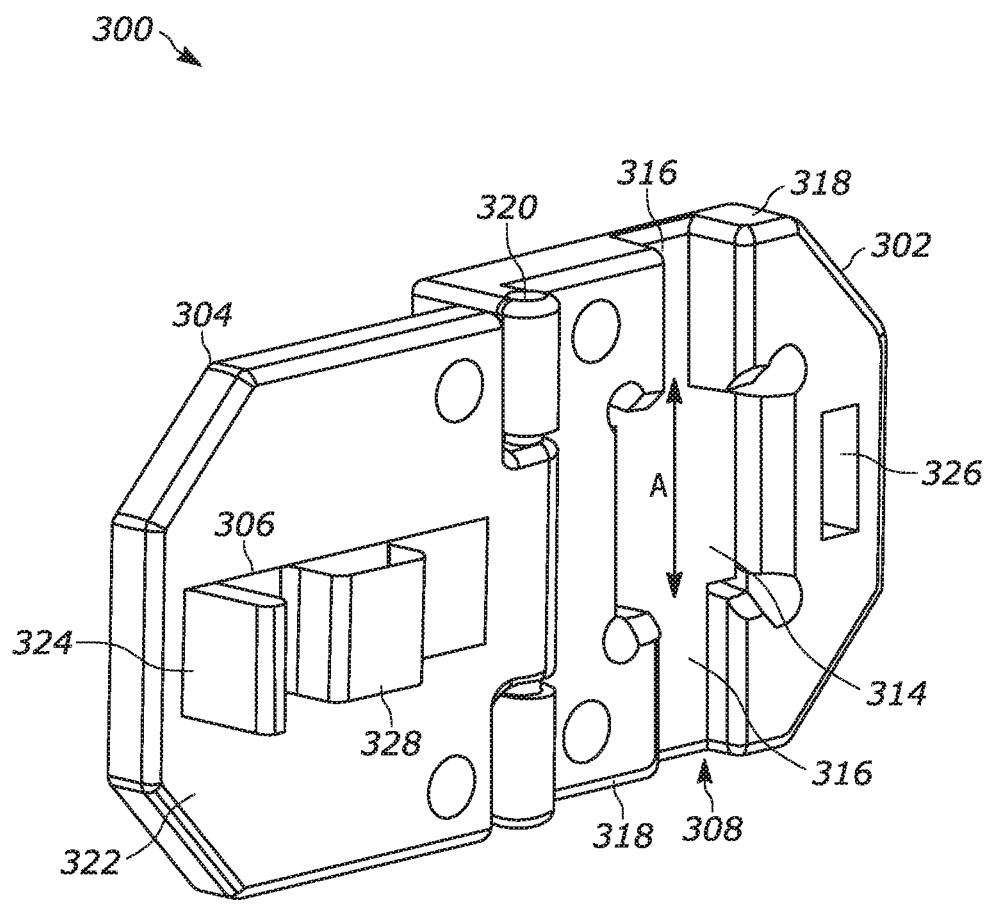
FIG. 3 is a perspective view of a superconducting interconnecting cable connector in an open position.
Figure 4:
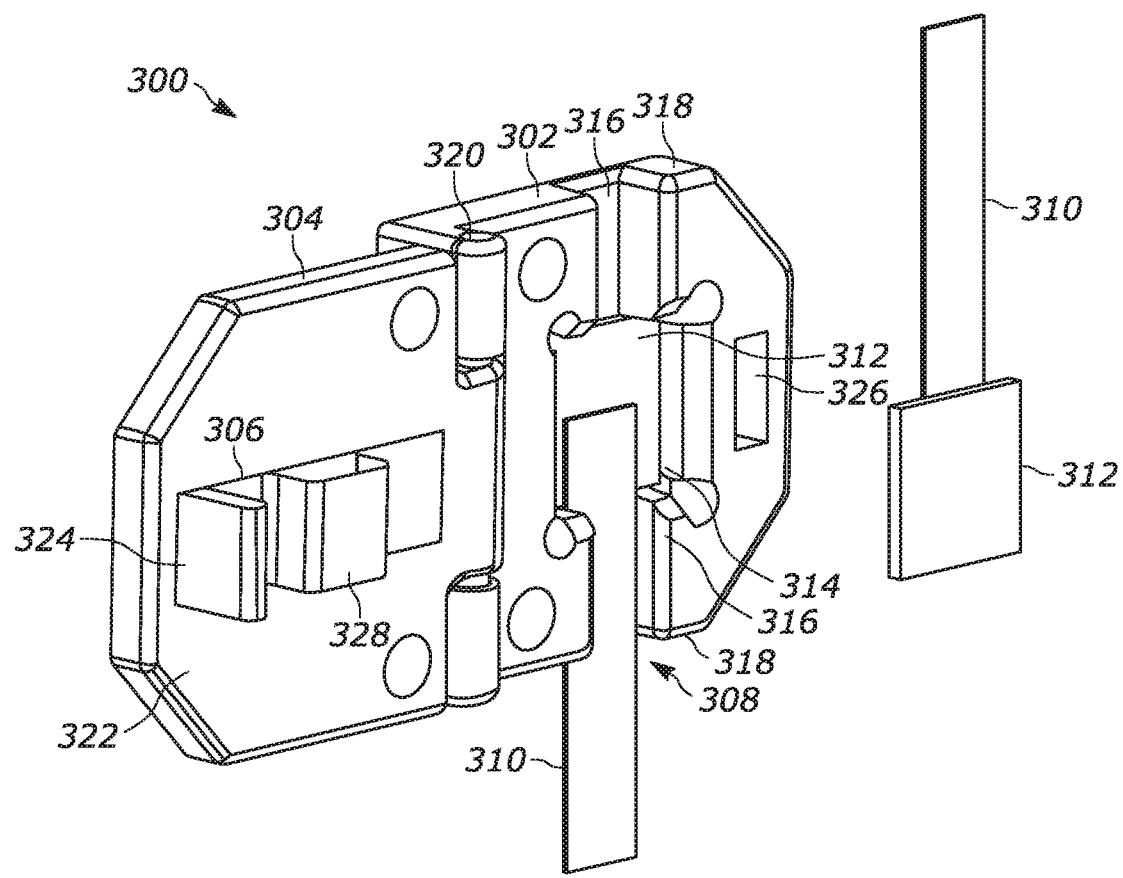
FIGS. 4 and 5 are perspective views of the superconducting interconnecting cable connector in an open position illustrating insertion of superconducting connecting chips and superconducting flexible interconnecting cables.
Figure 5:
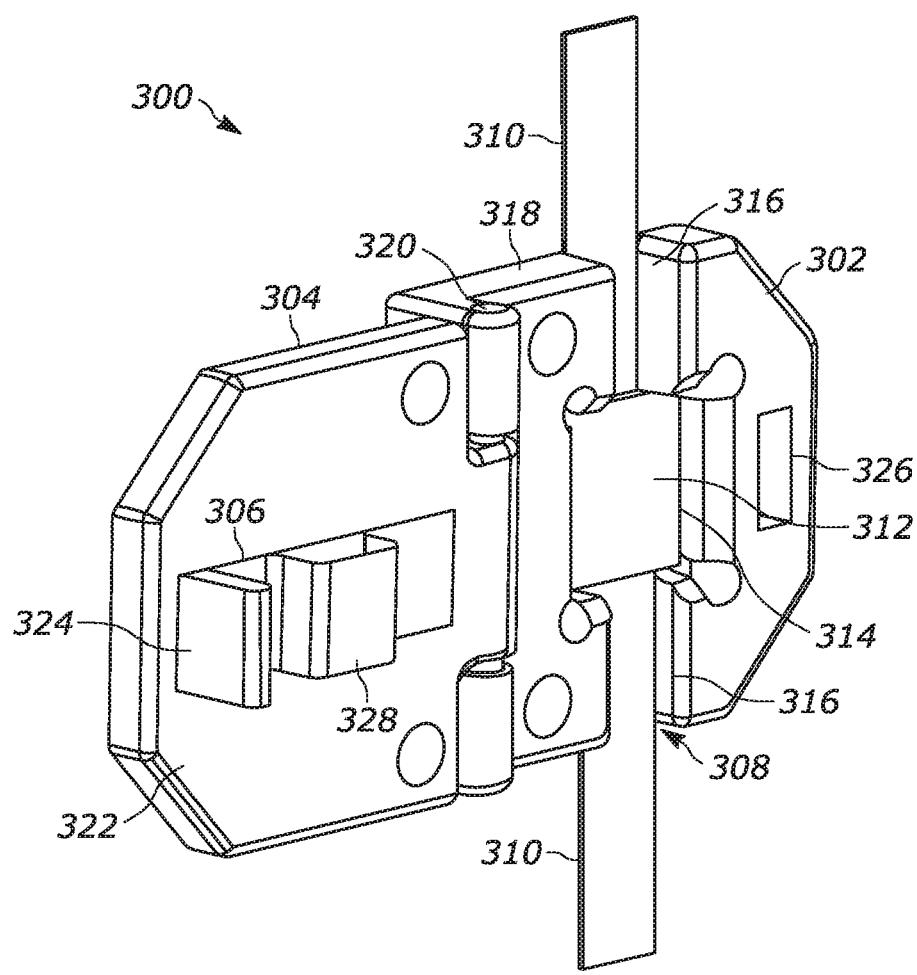
Figure 6:
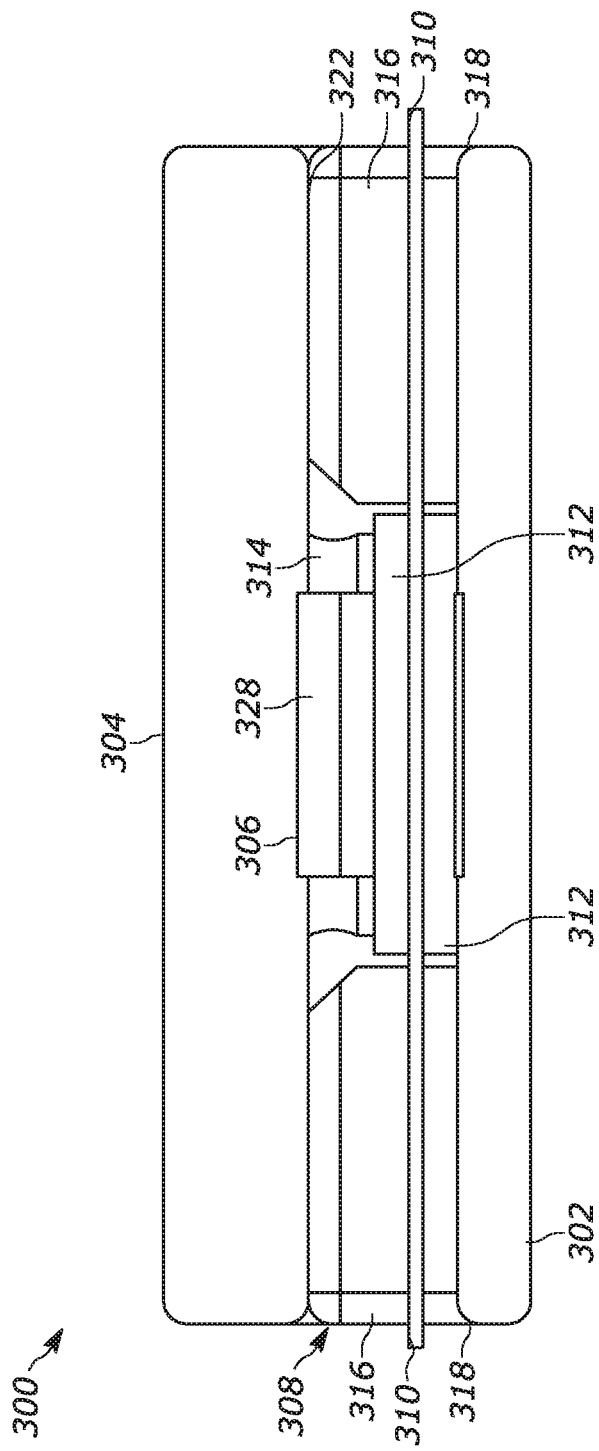
FIG. 6 is a cross section view of the superconducting interconnecting cable connector in the closed position.
Figure 8:
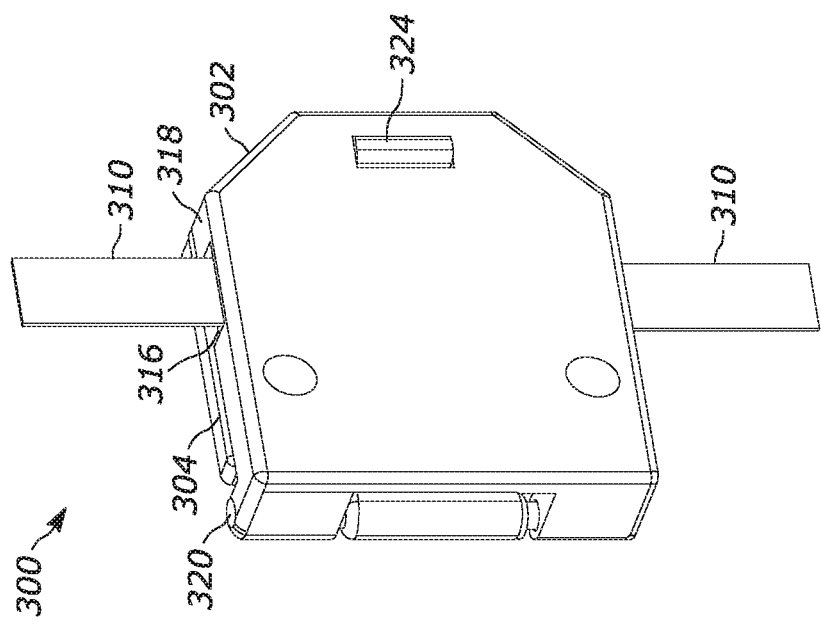
FIGS. 7 and 8 are front and rear perspective views respectively of the superconducting interconnecting cable connector.
Figure 7:
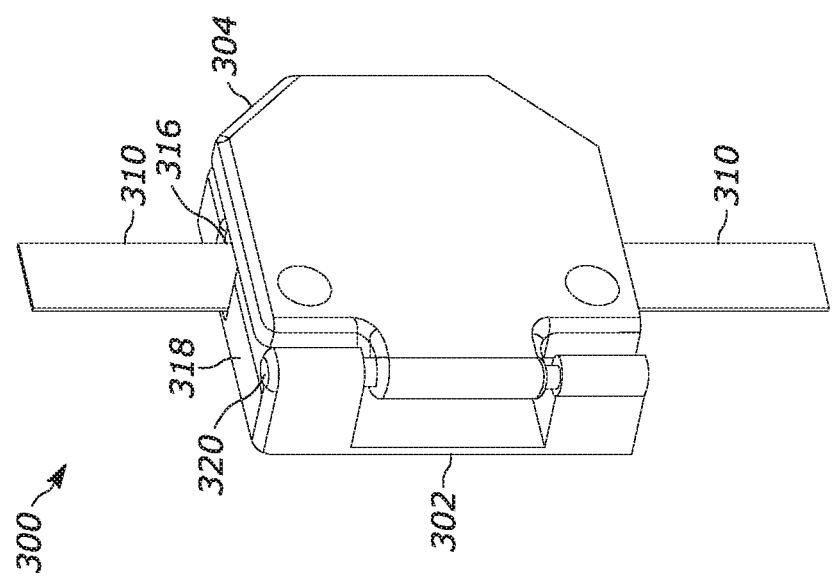

FIGS. 3-8 illustrate an example superconducting flexible interconnecting cable connector (hereinafter "cable connector") 300. Specifically, FIGS. 3-5 are perspective views of the cable connector 300 in an open position, FIG. 6 is a cross section view, and FIGS. 7 and 8 are perspective views of the cable connector 300 in a closed position. The cable connector 300 is similar to the cable connector 212 illustrated in FIG. 2. Thus, reference is to be made to the example of FIG. 2 in the following description of the example in FIGS. 3-8. The cable connector 300 includes a base 302, a cover 304 removably attached to the base 302, and a compression device 306.

The base 302 includes a recessed area 308 defined therein. The recessed area 308 is configured to receive superconducting flexible interconnecting cables (hereinafter "interconnecting cables") (e.g., Kapton tape) 310 and superconducting connecting chips (hereinafter "connecting chips") (e.g., silicon chips) 312 that connect to the interconnecting cables 310, as will be described below. The recessed area 308 includes a main recess 314 and a pair of channels 316. The main recess 314 is centrally defined in the base 302 in a longitudinal direction of the base 302. The longitudinal direction is defined as the direction identified by the double sided arrow A. In the example illustrated in the figures, the main recess 314 has a square shape to receive a square shaped connecting chip 312. It is to be understood however, that the main recess 314 can have any shape that conforms to a shape of the connecting chips 312 in order to secure the connecting chips 312 in the main recess 314. As will be described below, the main recess 314 is configured to receive the connecting chips 312 to facilitate in the electrical connection and electrical continuity between a pair of interconnecting cables 310.

The channels 316 extend out from each side of the main recess 314 in the longitudinal direction A to each longitudinal side 318 of the base 302. Thus, the recessed area 308 is defined in the base 302 from one longitudinal side 318 of the base 302 to an opposite longitudinal side 318 of the base 302. As will be described below, the channels 316 are configured to receive the interconnecting cables 310 and allow the interconnecting cables 310 to exit the cable connector 300.

The cover 304 is configured to cover the interconnecting cables 310 and the connecting chips 312 when the cover 304 is placed on the base 302 (i.e., in a closed position). In the example illustrated in FIGS. 3-8, the cover 304 is hingedly attached to the base 302 via a hinge pin 320. Thus, to close the cover 304 the cover 304 pivots about the hinge pin 320 and snaps to the base 302 in various ways. For example, in the example illustrated in FIGS. 3-8, the compression device 306 is attached to an inside surface 322 of the cover 304 and includes a latching mechanism 324. The latching mechanism 324 aligns and snaps into a latch receiving recess 326 defined in the base 302 when the cover is in the closed position. In another example, the cover 304 may be separate from the base 302 and may include alignment pins that snap into alignment apertures defined in the base 302 when attaching the cover 304 to the base 302.

The compression device 306 further includes a compression portion 328. The compression portion 328 aligns with and extends into the main recess 314 when the cover 304 is in a closed position (see FIGS. 6-8) to secure the interconnecting cables 310 and the connecting chips 312 in the main recess 314. More specifically, when the cover 304 is attached to the base 302, the compression portion 328 applies pressure and forces the connecting chips 312 together to secure the connecting chips 312 and the interconnecting cables 310 inside the cable connector 300.

To illustrate, FIGS. 4-6 illustrate how the interconnecting cables 310 and the connecting chips 312 are secured in the cable connector 300. A pair of interconnecting cables 310 (one each from two different MCM assemblies 202 illustrated above) and a pair of associated connecting chips 312 are secured in each cable connector 300. Each interconnecting cable 310 includes electrically conductive metal traces (not shown) on one side and a ground plane (not shown) on an opposite side. Similarly, one connecting chip 312 is coated with a ground plane and the other connecting chip 312 includes electrically conductive metal traces. The interconnecting cable 310 from one MCM assembly 202 is bonded to one connecting chip 312, as shown in FIG. 4. For example, the ground plane side of one interconnecting cable 310 is bonded, via pressure and a bonding adhesive, to the ground plane connecting chip 312. The other interconnecting cable 310 from another MCM assembly 202 is bonded to the other connecting chip 312, as shown in FIG. 4. For example, the metal trace side of the interconnecting cable 310 is bonded to the connecting chip 312 with the metal traces. The metal traces from the interconnecting cable 310 is bonded, via pressure and a bonding adhesive, directly to the metal traces on the connecting chip 312 to ensure electrical contact. The connecting chips 312 are then inserted into the main recess 314, as illustrated in FIGS. 4 and 5. The connecting chips 312 reside in the main recess such that one connecting chip 312 is placed on the other connecting chip 312 and such that the ends of the two interconnecting cables 310 butt up against each other, as illustrated in FIG. 6. The cover 304 is then placed on the base 302 such that the compression portion 328 applies pressure on the connecting chips 312 to secure the connecting chips 312 and the interconnecting cables 310 inside the cable connector 300 and to also ensure electrical contact between the metal traces on the interconnecting cables 310 and the metal traces on the connecting chips 312. The connecting chips 312 therefore, act as a bridge between interconnecting cables 310. The interconnecting cables 310 extend from the main recess 314 through the channels 316 and exit the cable connector 300 and connect their respective MCM assembly 202.

The size and shape of the connecting chips 312 correspond with a size and shape of the main recess 314. In other words, the connecting chips 312 fit into the main recess 314 such that there is no room for the connecting chips 312 to shift or move. In addition, the compression portion 328 of the compression device 306 applies pressure to the connecting chips 312 to ensure that the connecting chips 312 are secured in the main recess 314 and to also ensure electrical contact between the metal traces on the interconnecting cables 310 and the metal traces on the connecting chips 312.

Figure 9:
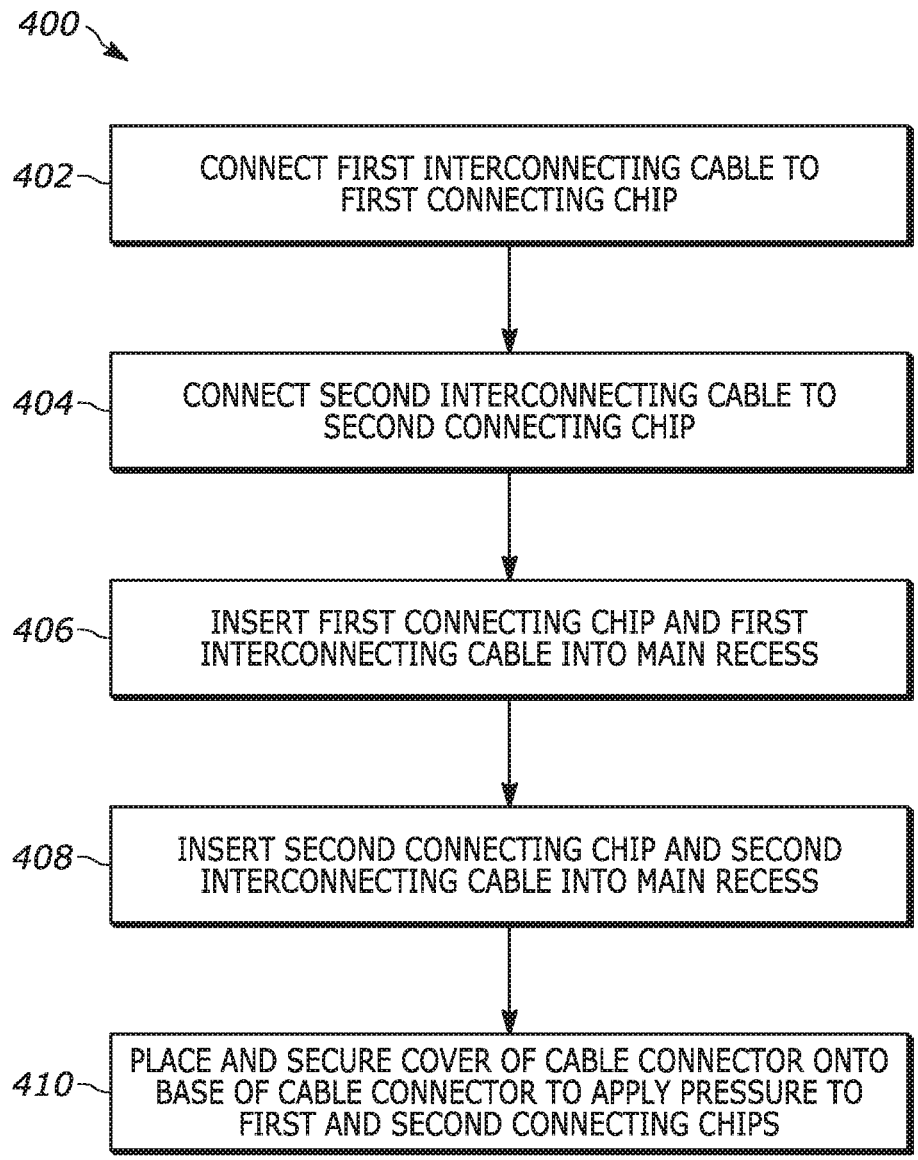
FIG. 9 is a block diagram illustrating a method of securing superconducting flexible interconnecting cables together.

FIG. 9 illustrates a method 400 of connecting superconducting flexible interconnecting cables (e.g., interconnecting cables 310) with a superconducting interconnecting cable connector (e.g., cable connector 300) to ensure electrical continuity between the interconnecting cables and hence, between multi-chip modules (e.g., MCM assembly 202) in a superconducting computing environment. At 402, a ground side of a first interconnecting cable from a first MCM assembly is bonded to a first superconducting connecting chip (e.g., connecting chip 312) coated with a ground plane, as explained above. At 404, a metal trace side of a second interconnecting cable from a second MCM assembly is bonded to metal traces on a second connecting chip, as explained above. At 406, the first connecting chip and first interconnecting cable are inserted into a recess (e.g., main recess 314) and a channel (e.g., channel 316) respectively of a base (e.g., base 302) of the cable connector. At 408, the second connecting chip and the second interconnecting cable are inserted into the main recess and channel respectively of the base of the cable connector. At 410, a cover (e.g., cover 304) of the cable connector is placed and snapped onto the base. As a result, a compression portion (e.g., compression portion 328) of a compression device (e.g., compression device 306) applies a pressure to first and second connecting chips.

As mentioned above, the superconducting interconnecting cable connector electrically connects a pair of interconnecting cables to each other thereby improving electrical continuity reliability. The main recess allows the interconnecting cables and connecting chips to nest with no shifting or movement. The compression device compresses the interconnecting cable connectors together to assure that no movement occurs within the recess and to ensure electrical contact between the interconnecting cables. As a result, the interconnecting cable connector provides a means to finely align the traces between the two interconnecting cables thereby improving reliability. In addition, since the interconnecting cable is easily removed from the interconnecting cable connector, the risk of breaking the interconnecting cable during replacement of components is mitigated.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A superconducting flexible interconnecting cable connector comprising:
    a base having a recessed area defined therein to receive superconducting flexible interconnecting cables and superconducting connecting chips to electrically connect the superconducting flexible interconnecting cables to each other;
    a cover to cover the superconducting flexible interconnecting cables and the superconducting connecting chips when the cover is in a closed position; and
    a compression device to compress the superconducting connecting chips together to secure the superconducting flexible interconnecting cables and the superconducting connecting chips inside the recessed area of the base when the cover is in the closed position.

2. The superconducting flexible interconnecting cable connector of claim 1, wherein the recessed area includes a main recess to receive the superconducting connecting chips and channels to receive the superconducting flexible interconnecting cables.

3. The superconducting flexible interconnecting cable connector of claim 2, wherein the channels extend in a longitudinal direction from each side of the main recess to each longitudinal side of the base.

4. The superconducting flexible interconnecting cable connector of claim 3, wherein the compression device includes a compression portion that aligns with and extends into the main recess when the cover is in a closed position.

5. The superconducting flexible interconnecting cable connector of claim 4, wherein the compression portion applies pressure to the superconducting connecting chips to ensure electrical continuity between metal traces in the superconducting flexible interconnecting cables and metal traces in the superconducting connecting chips.

6. The superconducting flexible interconnecting cable connector of claim 1, wherein the base further includes a latch receiving recess, wherein the compression device further includes a latching mechanism, and wherein the latching mechanism aligns with and snaps into the latch receiving recess when the cover is in the closed position.

7. The superconducting flexible interconnecting cable connector of claim 1, wherein the cover is pivotally attached to the base via a pivot pin.

8. A superconducting computing system comprising:
    superconducting multi-chip module assemblies in a stacked arrangement;
    superconducting flexible interconnecting cables electrically communicatively linking the superconducting multi-chip assemblies to each other;
    superconducting connecting chips electrically communicatively linking ends of the superconducting flexible interconnecting cables together; and
    superconducting flexible interconnecting cable connectors including a base having a recessed area to receive the superconducting connecting chips and the superconducting flexible interconnecting cables to ensure electrical continuity between metal traces in the superconducting flexible interconnecting cables and metal traces in the superconducting connecting chips.

9. The superconducting computing system of claim 8, wherein the superconducting flexible interconnecting cable connector further includes a cover to cover the superconducting flexible interconnecting cables and the superconducting connecting chips when the cover is in a closed position.

10. The superconducting computing system of claim 9, wherein the cover is pivotally attached to the base via a pivot pin.

11. The superconducting computing system of claim 9, wherein the superconducting flexible interconnecting cable connectors include a compression device having a compression portion that aligns with and extends into a main recess of the recessed area when the cover is in a closed position.

12. The superconducting computing system of claim 11, wherein the compression portion contacts and applies pressure to the superconducting connecting chips to secure the superconducting flexible interconnecting cables and the superconducting connecting chips inside the recessed area of the base when the cover is in the closed position.

13. The superconducting computing system of claim 12, wherein the base further includes a latch receiving recess, wherein the compression device further includes a latching mechanism, and wherein the latching mechanism aligns with and snaps into the latch receiving recess when the cover is in a closed position.

14. The superconducting computing system of claim 8, wherein the recessed area includes a main recess to receive the superconducting connecting chips and channels to receive the superconducting flexible interconnecting cables.

15. The superconducting computing system of claim 14, wherein the channels extend in a longitudinal direction from each side of the main recess to each longitudinal side of a base of the superconducting flexible interconnecting cable connector.

16. The superconducting computing system of claim 8, wherein the superconducting flexible interconnecting cable connectors are comprised of a non-magnetic metal.

17. A method of connecting a superconducting flexible interconnecting cable connector for a superconducting computing system comprising:
    bonding a ground side of a first superconducting interconnecting cable from a first multi-chip module assembly to a first superconducting connecting chip, wherein the first superconducting connecting chip is coated with a ground plane;

bonding a metal trace side of a second superconducting interconnecting cable from a second multi-chip module assembly to metal traces on a second superconducting connecting chip;

inserting the first superconducting connecting chip and the first superconducting interconnecting cable into a main recess and into a channel respectively of a base of the superconducting flexible interconnecting cable connector;

inserting the second superconducting connecting chip and the second superconducting interconnecting cable into the main recess and another channel respectively of the base of the superconducting flexible interconnecting cable connector over the first superconducting connecting chip; and securing a cover of the superconducting flexible interconnecting cable connector onto the base.

18. The method of claim 17, wherein when securing the cover of the superconducting flexible interconnecting cable connector onto the base, a compression portion of a compression device attached to an inside surface of the cover extends into the main recess and applies a pressure to the first superconducting connecting chip and to the second superconducting connecting chip to ensure electrical continuity between the first superconducting interconnecting cable and the second superconducting interconnecting cable.

19. The method of claim 17, wherein when the first superconducting connecting chip and the second superconducting connecting chip are placed in the main recess, an end of the first superconducting interconnecting cable and an end of the second superconducting interconnecting cable butt up against each other.

20. The method of claim 17, wherein when securing the cover of the superconducting flexible interconnecting cable connector onto the base a latching mechanism of the compression device latches into a latching mechanism recess to secure the cover to the base.

* * * * *